(12) United States Patent
Edwards et al.

(10) Patent No.: US 8,766,091 B2
(45) Date of Patent: Jul. 1, 2014

(54) SOLAR POWER HARVESTER

(76) Inventors: Oliver J. Edwards, Ocoee, FL (US);
Robert J. Horstmeyer, Palo Alto, CA (US)

( * ) Notice: Subject to any disclaimer, the term of this patent is extended or adjusted under 35 U.S.C. 154(b) by 1378 days.

(21) Appl. No.: 11/824,177

(22) Filed: Jun. 29, 2007

(65) Prior Publication Data
US 2009/0000613 A1    Jan. 1, 2009

(51) Int. Cl.
*H01L 31/052*    (2014.01)
(52) U.S. Cl.
USPC ............... 136/259; 250/203.01; 250/203.4; 126/684; 126/687; 126/692
(58) Field of Classification Search
USPC ................. 136/243–265; 126/569–713; 250/200–203.4, 559.49, 203.1–203.4, 250/236; 359/591–597; 160/34
See application file for complete search history.

(56) References Cited

U.S. PATENT DOCUMENTS

| | | | |
|---|---|---|---|
| 2,749,044 A | 6/1956 | Chace | |
| 4,031,385 A | 6/1977 | Zerlaut et al. | |
| 4,071,017 A | 1/1978 | Russell, Jr. et al. | |
| 4,106,480 A | 8/1978 | Lyon et al. | |
| 4,137,098 A | 1/1979 | Field | |
| 4,173,397 A * | 11/1979 | Simpson | 359/849 |
| 4,187,834 A * | 2/1980 | Hoinski | 126/574 |
| 4,220,137 A | 9/1980 | Tesch et al. | |
| 4,229,076 A | 10/1980 | Chromie | |
| 4,243,018 A | 1/1981 | Hubbard | |
| 4,249,514 A | 2/1981 | Jones | |
| 4,312,709 A | 1/1982 | Stark et al. | |
| 4,392,008 A | 7/1983 | Cullis et al. | |
| 4,519,384 A | 5/1985 | Murtha | |
| 4,520,794 A | 6/1985 | Stark et al. | |
| 4,546,757 A | 10/1985 | Jakahi | |
| 4,620,771 A | 11/1986 | Dominguez | |
| 4,632,091 A | 12/1986 | Wiens | |
| 4,690,355 A | 9/1987 | Hornung et al. | |
| 4,700,013 A | 10/1987 | Soule | |
| 4,784,700 A | 11/1988 | Stern et al. | |
| 4,870,631 A * | 9/1989 | Stoddard | 369/18 |
| 4,999,948 A * | 3/1991 | Hodgens | 49/74.1 |
| 5,054,466 A | 10/1991 | White et al. | |
| 5,169,456 A | 12/1992 | Johnson | |
| 5,203,318 A | 4/1993 | Chauvet | |
| 5,505,788 A | 4/1996 | Dinwoodie | |
| 5,522,944 A | 6/1996 | Elazari | |
| 5,542,409 A | 8/1996 | Sampayo | |
| 5,819,832 A | 10/1998 | Huang | |
| 6,349,718 B1 | 2/2002 | Ven et al. | |
| 6,971,756 B2 | 12/2005 | Vasylyev et al. | |
| 7,173,179 B2 | 2/2007 | Nicoletti et al. | |
| 7,192,146 B2 | 3/2007 | Gross et al. | |

* cited by examiner

*Primary Examiner* — Jonathan Johnson
*Assistant Examiner* — Christina Chern
(74) *Attorney, Agent, or Firm* — Tue Nguyen (57) ABSTRACT

A solar energy harvester comprises: an elongated stationary solar irradiance converter assembly; a concentrator comprised of a substantially flat array of flat reflective heliostatic slats disposed at tilt angles to concentrate the sun onto the converter assembly, said slats each rotating in elevation about a north-south axis; sun sensor detecting the efficacy of concentration as the sun traverses; and control circuitry and drive motor positioning the collector in elevation according to the sun sensor so that the slat array tracks and faces the sun whenever the solar incident energy is greater than a selectable threshold level.

27 Claims, 3 Drawing Sheets

SOLAR POWER HARVESTER

FIELD OF THE INVENTION

The present invention relates to solar power systems; and more particularly, it relates to a power station for converting solar irradiance to more useful forms of energy: electricity or heat or both electricity and heat.

BACKGROUND

Systems for harvesting solar irradiance, of the type with which the present invention is concerned, have application in remote areas where electricity or other utilities are not readily available. However, persons skilled in the art will readily appreciate that the present invention is more broadly directed to a solar energy conversion system, whether the useful energy is in the form of electricity or heat, and irrespective of its ultimate use. Even though the invention has such broader application, it will be disclosed in the context of a source of electrical power and as a source of thermal power for heating and air conditioning, both of which sources are useful in dwellings and office buildings.

In the past, the most widely employed solar energy converters for solar power harvesting have employed a number of photovoltaic cells mounted to a fixed, planar frame; this is sometimes referred to as a "flat panel" or "one sun" construction. The flat panel was positioned in a well-known manner to enhance the collection of useful solar energy. It is known that if solar energy falls perpendicularly onto the surface of a solar conversion cell, the energy conversion is at a maximum. The attitude and elevation of a solar flat panel in a fixed position for a given location on earth will provide a known maximum conversion of solar energy over the solar day throughout the year—that is, the number of generated watt-hours per day.

However, the number of photovoltaic cells required on a fixed flat panel for a usable power station, considering the various positions of the sun throughout the year, is so large that the system has been prohibitively expensive for conventional commercial use. Performance of this flat panel has been enhanced by providing a motor drive to point the panel at the sun through its diurnal travel. Enhancing the energy harvesting of one-sun collectors was accomplished by mounting the cell array on a tracking device. However, this required the use of a heavy frame and support structures to provide adequate wind resistance. Typically expensive mounting or base structures were required with tracking structures. This further increased the cost of fabricating, installing and maintaining such systems. Exposure to the environment resulted in corrosion, the most frequent cause of system failure.

This has been further enhanced by development of successive generations of more-efficient solar cells: at present typically 15%-40% conversion of sunlight into electricity is possible.

An important improvement has been made to decrease the cost of the photovoltaic material by concentrating the sunlight, by a rotationally symmetric parabolic reflector or a linear parabolic trough, which is driven to track the direction of the sun. Absent a use remote from a conventional power source, or else absent government subsidies, a tracking solar concentrator now offers the only potentially cost-effective approach to solar power generation.

Numerous methods for tracking the sun with a single-aperture concentrator such as a parabolic dish or trough have been taught; numerous others have addressed the use of co-tracking or group-deformable subapertures. Generally these involve the use of mechanical linkages, gears, and chain and sprocket drives; aside from general failure due to corrosion and wear, at best these generally are subject to pointing inaccuracy—and thus to loss of concentration effectiveness—through wind pressures, gear backlash, and pointing resolution.

In a perfect concentrator, the image of the sun will be imaged exactly into a minimal photovoltaic cell array. The angular size of the sun is ½ degree: thus if such a concentrator has a tracking error of ½ degree, it will capture none of the direct solar energy.

In all cases the commercial practicality of these successive innovations has been critically limited by the adverse disparity between the value of the solar-generated electrical power as compared with the amortized aggregated cost of the concentrator structure, the drive apparatus, and the photovoltaic cells themselves. Typically the time for return of the investment has exceeded the projected life of the apparatus.

In part because of the cost of the cells, others have sought to convert the sunlight directly into heating a working fluid. Typically solar hot water is used to provide domestic hot water; this can be obtained by circulating water through a simple rooftop array of black absorbing tubes. Today solar heating can further be utilized to power an absorption air conditioning or refrigeration unit utilizing a condensable fluid: specifically, for the "drying" or desorption portion of the cooling cycle. Less frequently, a solar concentrator is used to vaporize a working fluid to operate a generator as by a Rankine or Stirling cycle engine. In any of these cases the typical purely economic net benefit of investment has been approximately zero by the end of the useful life of the equipment.

Thus, an important aspect of a solar power station is its cost effectiveness: that is, the consideration of the total costs of acquisition, delivery, installation, maintenance, fuel, life expectancy, and the like—versus the market value of the utilities it would replace.

In a solar energy conversion system, the costs may be divided into three general areas. First, there is the necessary quantity of solar photovoltaic cells needed to provide the desired watt-hours of electrical energy per unit of time (usually the average minimum number of hours of sunshine per day). Secondly, there is the cost of electrical or mechanical parts in the system other than the solar cells, and the fabrication and installation costs. Finally, to be practical the life expectancy of a solar energy system should generally be at least 22 years, and therefore, maintenance and repair costs must be considered as part of the initial design. The past use of shafts, bearings, mechanical linkages, gears, and chain and sprocket drives to achieve solar tracking has militated against a cost-effective system maintenance cost and useful life. A common failure of prior systems has been due to physical damage and corrosive effects of exposure to the natural elements of wind, rain, snow, hail, humidity, dust, etc. Prior methods of minimizing the effects of weather have proved either too costly or too ineffective for sustained commercial use.

Electrical solar power has a value related to the conversion efficiency of the photovoltaic (PV) panel and to the cost of the net electricity it replaces; the production value of solar thermal power is related to the relatively low cost of the fuel it replaces. Almost all prior art has taught the production of only one and not the other. Some have taught the production of both electricity and useful heat, but with problems of efficiency and/or construction. While U.S. Pat. No. 7,173,179 teaches the use of a spectrum-splitting chemical solution which absorbs infrared light and transmits visible light to silicon on the rearward surface, this design significantly compromises the potential performance of the costly silicon. U.S. Pat. No. 5,522,944 teaches the use of a fixed plate of heat-absorbing fluid pipes in between solar cells, but without harvesting both electricity and heat at any one point of irradiance. U.S. Pat. No. 5,505,788 teaches a fixed roofing system in which convecting water cools a solar cell array; aside from this requiring that the entire roof be plumbed as a single water vessel, no provision is made for solar concentration.

It is well known that a major component of the entire system cost for a solar collector is the cost of installing the collector. In the case of systems that utilize a tracking device there is a major cost in both the tracker and the structural base for the tracker that is required for wind loading on the collectors that are mounted to the tracker and act as a sail.

Solar energy harvesters heretofore known suffer from a number of disadvantages:

(a) They utilize shafts, bearings, and pinion gears to enable rotation, with adverse effects on purchase cost, lifetime, maintenance cost and tracking accuracy.

(b) They utilize rigid parabolic concentrators of a mirror nature, which are expensive in manufacture, and structurally three-dimensional: with significant vertical dimension.

(c) They utilize tracking means which are necessarily massive to overcome wind pressures, costly to purchase, and require periodic and costly maintenance over a 22 year expected lifetime.

(d) Typically the time for return of the investment has exceeded the projected life of the prior art apparatus: the return on investment is negative. Even under the optimistic models, if the payback time exceeds 12 years than it is irrational in an economic sense to invest in solar power rather than in other available, higher-return (>6%) investments; no solar power harvesting system in the prior art has offered such a payback time.

When all the actual costs are accounted, typically the time to return the investment from the value of utilities presently saved (e.g., for San Francisco) ranges from 30 years for a "one-sun" photovoltaic roof-cover to between 30 and 150 years for a state of the art two-axis tracking parabolic dish concentrator.

(e) Substantially all the prior art has taught the harvesting of high value electrical power from the sunlight and considered the other 80% of the absorbed sunlight to be an engineering challenge to dissipate, or else has optimized the harvester to capture 100% as relatively low value heat, sometimes to be converted into electrical power through the further losses of conventional heat-engine generators.

(f) The optimum orientation of prior solar power harvesters, whether sun-tracking diurnally or not, is to be tilted toward the south at the angle of the local latitude. This requires a fortuitous choice of roof or else a construction of significant complexity and skyline bulk. Even with the most costly tracking: two axis, including the ±23.26° as the sun moves through its seasons, can collect a maximum of one sun over its area.

SUMMARY

In accordance with the present invention a solar irradiation power harvester comprises an array of equi-spaced flat mirror slats running north-south, each mutually parallel and suspended at each end by a single wire acting as a combined bearing and shaft, and each so oriented that it reflects sunlight onto a common focal line above the array. The wire at a drive end further comprises a rotary spring to bias the rotation of the slat. A mutual rotation means is provided such that each slat is rotated as needed to maintain its reflection optimally on the common focal axis. An irradiation power converter is provided which harvest both electrical and thermal energy. A flat reflective surface is provided at the north end which provides up to twice that harvested sunlight as obtainable in the prior art for a given harvester footprint.

Accordingly, several objects and advantages of the present invention are:

(a) to provide a solar power harvester which does not depend on shafts or bearings to locate its principal moving parts, and thus which provides a device with consistent tracking accuracy, minimum friction and wear, and minimum required maintenance.

(b) to provide a solar power harvester which can lie flat on a roof or field, and it is not required to track or re-orient the apparatus as a whole (c) To provide a solar power harvester which does not require the drives, controls, wind-resistant structure and motion of a rigid large aperture optical system, having a weather-protective enclosure which is low cost, sealed and self-cleaning over time (d) to provide a solar power harvester which can, within a small fraction of its lifetime, return a cash value equal to its total cost: including acquisition, installation, and maintenance costs.

(e) to provide a solar power harvester capable of harvesting valuable electrical energy by photovoltaic conversion at available PV efficiency, and harvesting the remainder as valuable thermal energy, thereby approximating a solar conversion efficiency of 100%.

(f) to provide a solar power harvester capable of producing up to 1500 watts of useful power in mid-latitude locations, per square meter of collector area.

Other features and advantages of the present invention will be apparent to persons skilled in the art from the following detailed description of a preferred embodiment accompanied by the attached drawings.

BRIEF DESCRIPTION OF THE DRAWINGS

In the drawings, closely related figures have the same number.

DRAWINGS

Reference Numerals

| | |
|---|---|
| 10 | heliostat |
| 12 | mirror slat |
| 14 | solar energy converter |
| 16 | wire pivot, tension member |
| 16A | wire adjacent terminating index |
| 16B | wire adjacent terminating pivot |
| 17 | Optional stabilizer bar |
| 18 | path of incident solar irradiance |
| 20 | common focal line |
| 22 | terminating pivot |
| 24 | terminating index |
| 26 | frame generally |
| 28 | pivot mount |
| 30 | drive mount |
| 32 | tensioning spring |
| 34 | follower pin |
| 36 | array positioner |
| 38 | comb teeth |
| 40 | base frame |
| 42 | drive motor |
| 43 | sun |
| 44 | threaded shaft |
| 46 | preloading spring |
| 48 | coolant pipe |
| 50 | photovoltaic cell strip |
| 52 | Free end of wire 16B |
| 54 | sun sensor |
| 56 | microprocessor |
| 58 | temperature sensor |
| 60 | housing |
| 62 | upper side of housing |
| 64 | south side of housing |
| 66 | north side of housing |
| 68 | reflective north wall |
| 70 | simply utilized section of collector |
| 72 | simply illuminated section of converter |
| 74 | additional collector-reflector utilized section of collector |
| 76 | additional collector-reflector utilized section of converter |
| 78 | further reflector-collector utilized section of collector |
| 80 | further reflector-collector utilized section of converter |
| 82 | virtual solar power harvester |
| A1, A2, A3 | various rays of incident sunlight |
| R1 | sunlight first striking the north reflector |
| N | lower limit of sun sensor signal |
| T | Temperature of converter |
| L | Upper limit of converter temperature |

DETAILED DESCRIPTION OF THE INVENTION

In the present invention, a solar power harvester utilizes: a planar array of flat, tilted reflective slats which together give the effect of a parabolic mirror trough, an elongated stationary energy converter positioned at the focal axis of the planar parabola, a sun sensor which locates the centroid of the reflected image of the sun relative to the converter, and a weatherproof housing transparent in the direction of the sun and having an extended reflective north wall.

The mirror slats are each mounted to rotate in an east-west direction about an axis formed by a wire at either end, held in tension along the length of the slat. The use of wire as both supporting rotary axes enables the indefinite use of the invention without wear, friction, or backlash in the support subsystem. Control circuitry, responsive to the output signals of the sun sensor, actuates a drive motor to position slats of the planar parabola in elevation to track and reflect the sun onto a common focal axis above the slat array whenever the incident solar energy is greater than a selectable threshold level of approximately 20% of normal noon value. The mirror slats are thin reflective sheets tensioned axially from supporting end plate structures; each is both lightweight and balanced about its center of rotation to require very little power to track the sun, and together form a heliostat.

The elongated energy converter is supported in a fixed position at the focal axis of the heliostat, attached to the frame structure that also stabilizes the slat array. In one embodiment the converter is a tube structure through which coolant fluid flows to harvest solar heating. The coolant fluid can be pressurized up to 40 psig to heat the fluid, e.g. water, up to 140° C. without boiling. In a second form the converter is an array of photovoltaic cells lying in the focal line of the focal line to harvest solar power as electricity. The converter can also incorporate circulating coolant fluid for cooling the solar cells, for example, keeping the solar cells below 50° C. to retain solar cell efficiency. In a preferred form the converter combines these modes of power harvest to produce both valuable electricity and valuable heat.

Because of its ability to track the sun, the present invention has a number of significant advantages as compared to a conventional solar flat panel; among which is the fact that over a given day, it is able to produce more watt-hours of electrical power per unit of time for a given number of solar cells. Hence, the number of solar cells for given electrical requirements will be reduced significantly.

Further, the 80% or so of "waste" heat from the solar spectrum not converted to electricity may be harvested by the coolant fluid to provide useful energy; thus substantially all of the solar irradiance is beneficially utilized. The efficiency of utilization combined with the low cost of the construction materials makes the present invention economically practical in small and large installations. The harvested heat may be utilized directly for heating in winter, and indirectly for air conditioning in summer. Air conditioning may, for example, be provided by evaporation from a water bath under vacuum, with the chilled water serving to cool an air conditioner cycle by heat exchange. The evaporated water is adsorbed into a desiccant chamber until saturated; with control circuitry the harvested heat is valved through the dessicant to drive off the adsorbed water which is pumped off to ambient. Thus a large dwelling space may be fully air conditioned at the electrical energy cost only of a small vacuum pump and fan motors.

The present invention overcomes many of the economic disadvantages of prior solar flat panel constructions by collecting and concentrating the incident energy onto available photovoltaic cells and thus by reducing the number of cells required. Assuming the same size cells with the same output rating are used, by concentration a typical reduction in the number of solar cells is typically 90% to 99%%; that is, only 1% to 10% of the number of solar cells is required for equivalent watt hour output. Cooling the cells allows for improved photoelectric conversion efficiency, and utilizing the coolant energy to heat, to air condition, or to generate additional electrical power enhances the economic utility of the system. By harvesting the heat not converted into electricity, nearly all the available sunlight is converted into useful, marketable power. Low manufacturing cost, low installation cost and unlimited operational life is obtained by the use of tensioned wires instead of shafts and bearings in the scanning machinery.

One or more converter assemblies, including the support frame, planar mirror array, linear converter, and the drive mechanism for the mirror array are preferably all located within an enclosed, stationary housing, the top and south faces of which is transparent to incident solar energy. That is to say, the housing and linear converter and associated plumbing are all stationary, and the mirror slats are free to move within the housing to track the sun. Preferably, the housing is in the form of a closed base structure and gabled transparent window, sealed and secured together. This feature has several important advantages. First, the fluid plumbing and wiring for the linear converter do not flex or twist as the sun is tracked, and all components may be made lighter because they do not have to resist wind forces; thereby the mechanical support requirements are simplified, substantially reducing the size and electrical power of the drive mechanisms. Secondly, the sealed enclosure keeps moisture, dust and other weather elements out of contact with the solar cells, the mirror surfaces, the drive mechanisms, and other portions of the system which would otherwise deteriorate if exposed to the elements. Finally the use of a gable structure for the windows makes them essentially self-cleaning, unlike present windows on flat roof solar collectors.

The present invention thus provides a solar energy conversion system which has a cost effectiveness enabling it to be economically used as an electrical and thermal power station. Not only is the initial cost relatively low, but the system is reliable both electrically and mechanically, and the complete environmental protection afforded by a sealed enclosure increases reliability and life and reduces maintenance. The present system provides the solar energy converter assemblies in an electrically and mechanically modular form so that standard "modules", i.e., single self-contained system units or assemblies can be manufactured, shipped and then connected in series, parallel or series-parallel circuit combinations whenever the user's total power requirements exceed the output capacity of an individual module.

Figure 1:
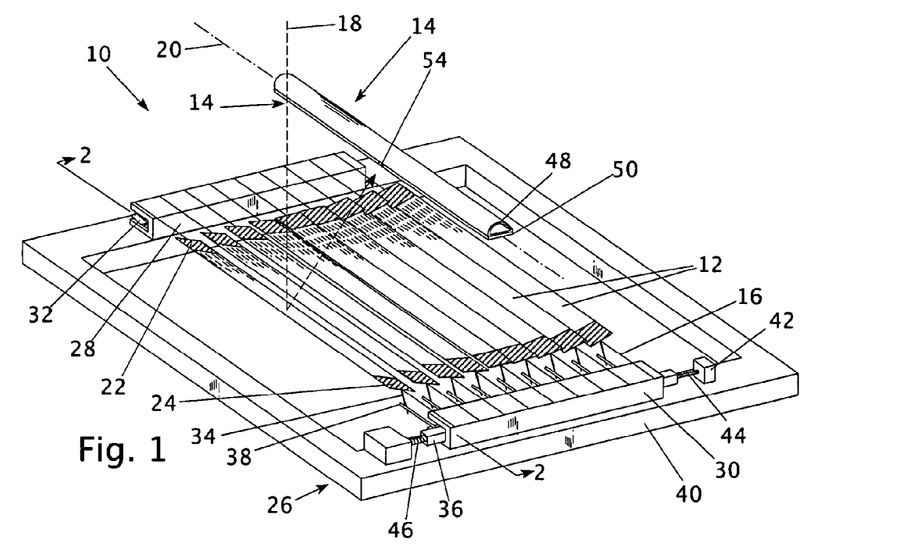
FIG. 1 shows a perspective view of a solar power harvester constructed according to the present invention.

Referring first to FIG. 1, reference numeral 10 generally designates a concentrating heliostat in the form of a Fresnel reflector, made of a plurality of flat reflective mirror slats 12 below a solar energy converter generally designated as 14, suspended in a substantially planar array by wires with axes parallel to converter 14. Though flat, the heliostat acts as a parabolic trough with each slat 12 reflecting a bar of incident sunlight 18 onto a common focal line 20. Energy converter 14, shown here for clarity without its conventional external plumbing and support frame, may be designed to be useful as a heat source, a photovoltaic electric power source, or in a preferred embodiment: a combined heat and electric power source.

Each slat 12 is terminated and gripped at one end by a terminating pivot 22 and at the other end by a terminating index 24. Each terminating element 22 and 24 has provision for securing one end of a wire 16 at its axial center. These wires 16 are maintained in axial tension from the axial centers of each end of each slat 12 to fastening points on a frame, generally designated as 26. These wires 16 fix the respective rotary axes of slats 12 in relation to frame 26, and allow the slats to rotate about their respective centerlines, without the friction drag, hysteresis, centration tolerance, temperature influences and limited life of prior art bearing mounts used in solar collection.

Pivot mount 28 is affixed to frame 26 opposite from drive mount 30; pivot mount 28 positions contiguous wires 16 and maintains them in tension from the ends of respective slats 12. Alternately, pivot mount 28 and drive mount 30 may be made integral to frame 26. A tensioning spring 32 anchored to the pivot mount 28 is attached to one end of each respective wire to maintain the tension as structural components change dimension with time, external stresses and varying temperature. This spring may be compressive or extensional or, as shown here for exposition, a leaf spring.

At manufacture, each slat 12 has affixed to its drive end a terminating index 24. Affixed to each terminating index 24 is an element by which all slats are co-rotated substantially the same amount at all times. Thus, as the sun moves 10° all the slats rotate 5°. Techniques for co-rotating the slats might include a shared chain drive, toothed or un-toothed wheels with idler wheels between, or independent motor drives.

In a preferred embodiment here illustrated, a lever in the form of a follower pin 34 is attached to each index 24 at assembly, such that all such pins 34 are substantially parallel when the slats are each positioned to optimally reflect sunlight onto the common focal axis 20 at local noon. The pins 34 are preferably both at the slat center line and at right angles to wires 16. The other ends of these levers or pins 34 are manipulated by the comb teeth 38 of an array positioner 24 to cause all slats 12 to rotate in unison.

Also at assembly, each wire 16 adjacent the respective follower pin 34 is preloaded with a twist at the time the follower pin is released to rest against the respective comb tooth 38. This twist in the wire 16, typically 180°, serves as a rotary spring to bias the position of each follower pin against its respective comb tooth throughout the daily sun-tracking cycle.

Surrounding frame 26 is here illustrated for exposition as divided into a drive mount 30 and pivot mount 28 mounted on a base frame 40, although the frame 26 may have any equivalent mechanical configuration, such as for one example: physically integrating the functions of the illustrated drive mount 30 and pivot mount 28 monolithically into base frame 40.

The array positioner 36 is mounted on drive mount 30 such that positioner 36 has but a single degree of freedom: motion along its long axis parallel to the long axis of drive mount 30. Comb teeth 38 supported by array positioner 36 may be thin rods as illustrated or may alternately be made of sheet metal.

Wires 16 are affixed along drive mount 30 with equal separation between wires. This separation is somewhat larger than the width of slats 12 to allow the slats to rotate without mutually interfering. Comb teeth 38 lie in a plane parallel to the plane containing wires 16, and are each parallel to wires 16. The contact points between pins 34 and comb teeth 38 are separated by substantially the same distance as that between contiguous wires 16.

A drive motor 42 mounted on base frame 40 is connected to array positioner 36 to move the latter axially. In a preferred embodiment, this is a stepping motor with a threaded shaft 44 into the array positioner 36 as shown. In other embodiments the motor might be a linear motor, or a rotary motor driving the array positioner by a gear train or a wire wrapped on a capstan. A preloading spring 46 at the other end of the array positioner 36 serves in compression or extension to preload the array positioner interface so as to remove backlash.

Solar energy converter 14 serves to absorb the concentrated sunlight from heliostat 10 and to convert the sun power into useful power. In one embodiment this converter 14 is an elongated coolant pipe 50 concentric with the focal line 20 at the focus of the heliostat, is blackened at least on its lower surface facing the heliostat so as to absorb solar irradiance, and conducts a heat-absorbing fluid such as water. With the flow mediated by valves and a remote thermostat as would be conventional in the art, this fluid may be used for domestic heating, air conditioning, water distillation, or to run an external heat-powered generator, as for example by a Stirling cycle engine.

In an alternate embodiment converter 14 may be an array of photovoltaic (PV) cells 50 which convert light to electrical power. There is a broad art taught for making such PV cells, varying typically from 10% to 40% in efficiency of conversion of sunlight to electrical power. The cost of such PV cells is such that it is desirable to minimize the area of such a solar PV array required to capture the concentrated solar irradiance.

The PV cell strip 50 is assembled from a plurality of individual solar cells, selected according to any desired combination of cell properties such as materials, cost, efficiency, and physical size. In one embodiment PV cell strip 50 is vee-shaped, with each side faced toward that slat 12 which is halfway between the periphery and center of the planar array of mirror slats. Preferably the PV cell strip 50 is planar, parallel to and over the center of the plane of the mirror slat axes. For the case where the PV cell array is flat and parallel to the plane of wires 16, and wires 16 have equal spacing and comb teeth 38 have the same spacing, light from the outermost slats 12 will illuminate the PV cells from an angle and the required width of PV cells will be proportional to the cosine of the angle between the plane of wires 16 and the plane of light reflected from the outermost cell. However, the next slat toward the center of the array is tilted up and its edge blocks a portion of the reflected light. Thus only the light from the upper portion of the outermost slat serves to illuminate the PV array, thus illuminating a relatively narrow strip of the PV array adjacent the edge nearest the reflecting slat. Thus one may ideally decrease the width of the PV array by slightly rotating each slat to bring its usefully reflected bar of light to symmetry with the centerline of the PV cell. It can be shown that by this method of biasing the slat orientation the required width of the PV array may be decreased to equal the width of a single slat. The PV width is further increased to account for the ½° angular diameter of the sun, and increased further to allow for imperfections in tracking alignment relative to the direction of the sun. In a typical case this will lead to making the width of the PV cell strip to be less than twice the width of one of the slats, in order to capture substantially all the sunlight reflected from the array of slats 12.

Figure 2:
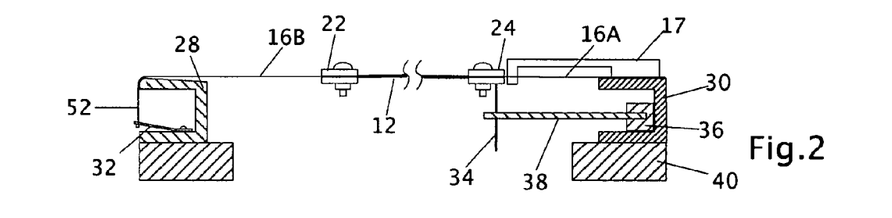
FIG. 2 shows a cross sectional view of the solar energy converter assembly.

FIG. 2 shows a sectional view of the solar concentrator of FIG. 1. Wire 16A supports the slat 12 end nearest the comb teeth 38, which are in turn affixed to array positioner 36. Optional stabilization rod 17 abuts wire 16A and serves to prevent lateral motion wire 16A as the slat is forced in rotation by the pressure of follower pin 34 on comb tooth 38. Follower pin 34 is affixed to a side of slat 12 orthogonal to and intersecting the axis of wire 16A. Here array positioner 36 is translated in and out of the plane of the drawing to alter the position of pin 34 in its rotation about wire 16A. Array positioner 36 is mechanically constrained in contact with drive mount 30 such that it has a single degree of freedom; the two are made of the same metal and are in thermal contact such that they remain effectively at the same temperature. Thus thermal expansion is approximately equal in both, and the relative alignment of pins 34 is unaffected over a range of system temperatures. The other end of slat 12 is attacked at its center to wire 16B, which provides its pivot point. Wire 16B is supported by pivot mount 28. Attached to pivot mount 28 is tensioning spring 32 which provides a tension in wire 16B and thus in wire 16A. This spring 32 is here shown for illustration as a leaf spring pulling on the free end 52 of wire 16B, though many other equivalent embodiments of a tensioning spring will be obvious.

Wire 16A serves as both rotary spring and pivot in tension; wire 16B serves as pivot in tension. Thus the wires are preferably of different free lengths and diameter. Wire 16 B should be made as thin as possible, with a breaking strength some three times that of the maximum tension in the slat for a safety margin. This enables it to act essentially as a frictionless bearing with negligible reverse torque on slat 12. Wire 16A is sized to provide a light pressure of pin 34 on comb tooth 38, noting that the torsional force in a wire is proportional to the fourth power of diameter and inverse as length.

Further strengthening of slat 12 in torque may be obtained by affixing a thin-wall very small diameter metal tube to the underside of slat 12, of the same material (for example, aluminum or stainless steel). This adds very little weight to affect the longitudinal sag, but adds a rotationally rigid element to the long ribbon-like slat.

At assembly the array of combined pins 34 and slats 12 is assembled with pins 34 pointing up, away from comb teeth 38; then the slats are simultaneously rotated 180° downward to engage comb teeth 38. Thereafter wire 16A exerts a torque on pin 34, maintaining it pressed against comb tooth 38 as array positioner 36 traverses. In this manner each slat 12 experiences precisely the same forces and torques as all others during a full day of operation, as the slats are together rotated by motion of array positioner 36.

Figure 3:
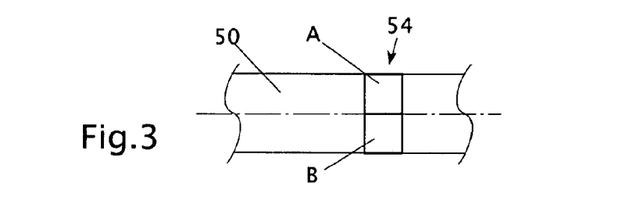
FIG. 3 shows a bottom view of the sun sensor and photovoltaic cell strip.

FIG. 3 shows the underside of the PV cell strip 50, and the sun sensor 50 centrally located coplanar with the PV cell strip. The sun sensor is divided into two PV cells of equal area, producing signals A and B, disposed symmetrically about the center of PV cell strip 50. When the pattern of the sum of the reflected light is centered on the PV cell strip, the cells A and B are equally illuminated.

Figure 4:
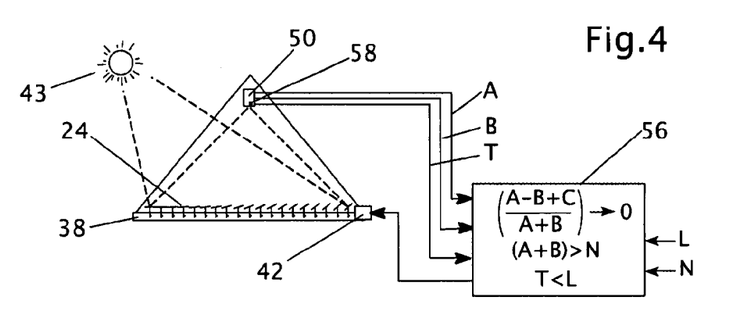
FIG. 4 shows a functional block diagram of sensing, control and drive circuitry for the sun-position sensing and tracking system of FIG. 1.

In FIG. 4 the signals A and B are fed to a prior art microprocessor 56 which serves to generate the normalized error signal (A−B) divided by (A+B) and to actuate the drive motor 42 such that it minimizes this error signal. Thus the heliostat optimally tracks the sun 43 in its movement: centering the net solar image from the heliostat on the energy converter 14.

At such times as the sum of cell signals (A+B) is less than a pre-selected value N such as 20% of typical noon value, microprocessor 56 operates drive motor 42 to return the mirror slats 12 at twilight or night to their extreme eastward direction, for next-day acquisition of the rising sun.

In another embodiment it is desirable to limit the upper temperature of the converter 14 to a value considered "safe," as for examples: to prevent circulating cooling fluid from boiling, or the PV cells from being overheated. A sensor 58 measuring temperature T in the out-flowing cooling fluid, and/or a temperature sensor embedded in the PV cell strip may be used to limit the total irradiance on the energy converter 14 by advancing or retarding the motion of the rotating slats 12. Conveniently this may be done by adding a signal C to form a substitute normalized error signal (A−B+C) divided by (A+B), where C is made proportional to the amount by which a measured temperature exceeds a pre-selected "safe" limit L.

For one example of a method of system assembly, the frame 26 is assembled, including motorized array positioner 36 having attached comb teeth 38:

(A) the slats 12 are placed, mirror side down, with attached terminating pivot 22 and terminating index 24, into a forming jig (not shown) which supportively tilts them each about their long axis at the correct angle for reflecting—e.g., the noon sun—onto the common focal line 20 when they are reverted.

(B) Each of the follower pins is affixed to its respective terminating index 24, mutually parallel with the other pins 34, and for example, substantially vertical.

(C) A first wire 16A is attached to each respective terminating index 24 at the axis of rotation, and the other end of the same wire 16A is affixed to the drive mount 30, with equal spacing between wires sufficient to allow the slat edges to rotate past each other. In a preferred embodiment this first wire is relatively thick, to act as a rotary spring to maintain a light pressure of the follower pin 34 against its respective comb tooth 36.

(D) A second wire 16B is affixed to the terminating pivot 22, stretched past pivot mount 28, and affixed to the free end of the tensioning spring 32. This spring 32 sets the tension in the wires and slat. This second wire 16B is relatively thin and long, with a rotary strength of a small fraction of that of first wire 16A; thus it acts as a frictionless and wear-free bearing and pivot for the end of the slat 12 adjacent the pivot mount 28.

(E) With the forming jig next removed from under the slats 12, all the tensioned and supported slats 12 are together rotated bout their long axes approximately 180° to bring the follower pins 40 into compressive contact with their respective comb teeth 36.

Figure 5:
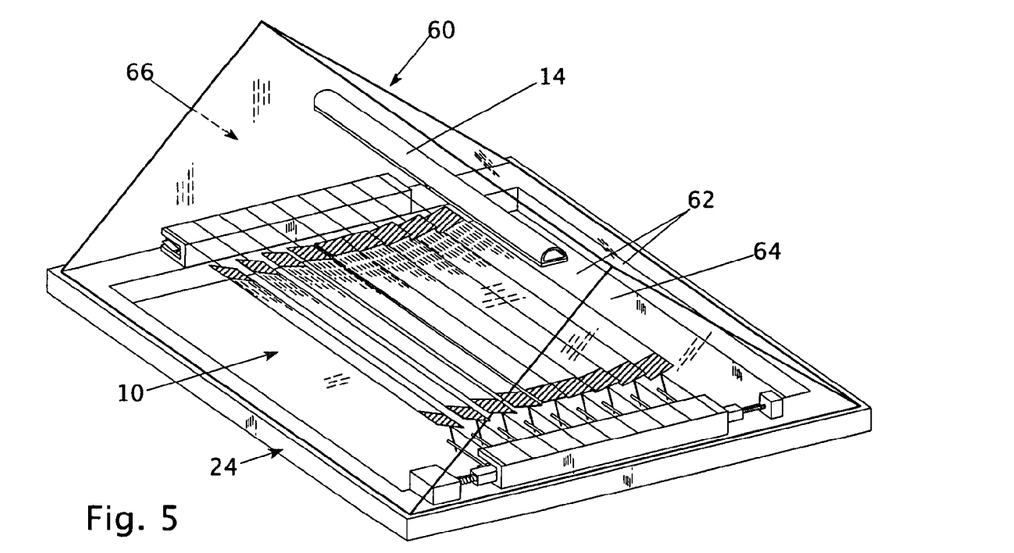
FIG. 5 shows a perspective view of a solar power harvester including its transparent enclosure, constructed according to the present invention.

In FIG. 5, the heliostat 10 and solar energy converter 14 are shown in a preferred embodiment enclosed by a housing generally designated as 60, affixed to frame 26. Housing 60 has transparent surfaces on the upper sides 62, and a transparent surface on the south side 64. In a preferred gable structure as illustrated, the housing 60 is self cleaning of environmental contaminants: a major advantage. Additionally, a gable structure presents stagnant air surrounding the energy converter 14; with no convective air currents, heat loss to the environment is minimized.

When the plane of heliostat 10 is tilted southward at an elevation angle less than the latitude angle, the transparent window gable 64 facing substantially south will transmit additional sunlight to illuminate the slat array. In this case also an added power enhancement of captured irradiance may be obtained by reflection: the inner (south-facing) surface of the northern surface 66 of housing 60 may be made into a mirror surface. This has the effect of folding space to usefully add virtual length to the slats and solar converter, at minimal additional cost.

Figure 6A:
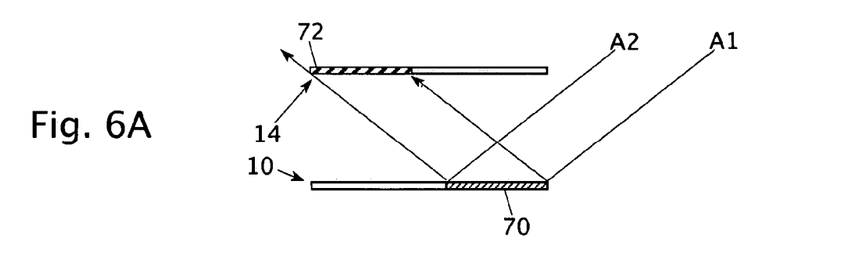
FIG. 6A shows a view of the sunlit useful portions of a solar power harvester module, looking east

FIG. 6 is sketched looking eastward through the solar power harvester system. In FIG. 6A this benefit of a reflective north wall 68 is illustrated for the example of solar power harvester of the present teaching, as installed flat with a north-south axis of slat rotation, with a noon sun elevation angle of 38°. Ray A1 is that ray reflected by the southern edge of the heliostat collector 10 and absorbed by the solar energy converter 14. Ray A2 is the northernmost reflected ray which is also absorbed. We see that less than half of the mirror is utilized as indicated by bar graph 70. Similarly, less than half of the converter 14 is illuminated, as indicated by the bar graph 72.

This, of course, is the motivation in the prior art for tilting a solar collector assembly to the angle of the latitude: at considerably increased cost; at a considerable loss of available space as successive east-west rows of such tilted collectors must be widely separated to avoid shadowing each other; and at the cost of adjusting the tilt angle through the year as the sun goes through its seasonal north-south traverse.

Figure 6B:
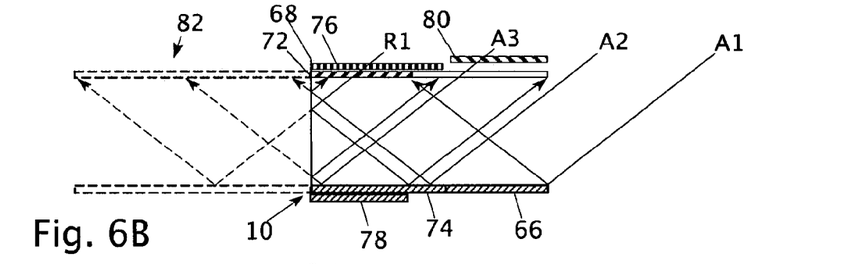
FIG. 6B shows the same as FIG. 6A, with the addition of a sunlit reflective north wall

FIG. 6B indicates the benefits of the present invention: adding a reflective north wall to any horizontal solar energy harvester. Sections 70 of the mirror and 72 of the converter perform the same as in FIG. 6A. However, section 74 of the collector 10 reflects additional rays such as A3 which now are reflected by the mirror 68 onto section 76 of the converter. Finally, additional rays R1 first strike the north mirror 66 and are reflected from collector section 78 onto converter section 80. The efficiency (concentration) of the harvester system has increased from approximately 40% to approximately 140%.

This may be conceived as the sunlight falling onto a virtual harvester 82 as well as the real harvester of FIG. 6A. Alternately, one may usefully consider the harvester illuminated by the real sun of FIG. 6A as well as by a virtual sun reflected by mirror 66.

Figure 6C:
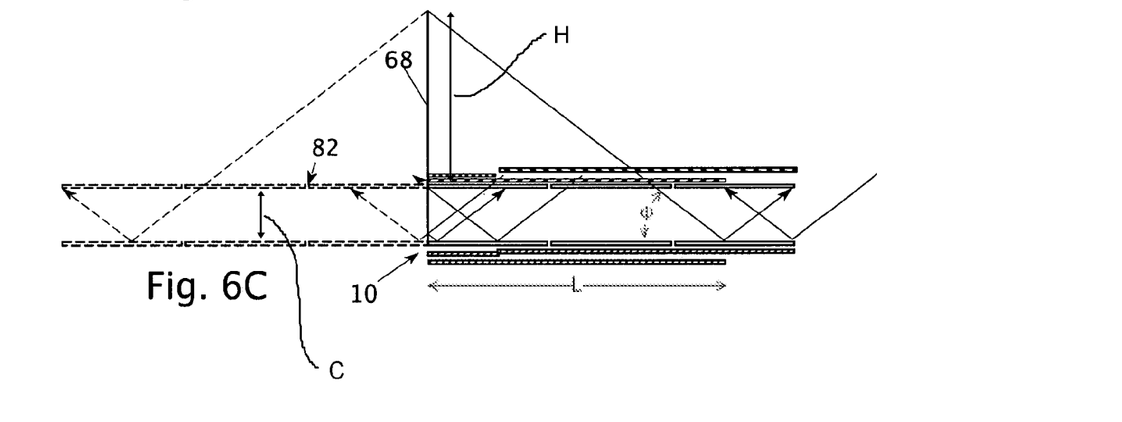
FIG. 6C shows a north/south column of three sunlit modules from FIG. 6A joined to make one long solar power harvester, with the operation of a north reflective wall

FIG. 6C indicates the benefit is a single wall constructed to serve a long harvester. Here three FIG. 6A harvesters are lined up axially and north-south, and a single reflective north wall 66 serves them all. By inspection, it can be seen that the addition of the north wall of a sufficient height H very nearly doubles the efficiency (concentration) of the heliostat collector 10. Construction costs of such a north wall would be comparable to that of a small highway sign board, with a facing of polished aluminum sheet. This may be expected to be a very small fraction of the cost of physically duplicating the solar power harvester itself.

It can be shown that: for a height C of the converter above the collector, a total length L of collector, at a maximum sun altitude Ø (latitude+23.5° in summer), the minimum vertical-mirror height H to fully utilize the reflectable sunlight will be $$H = (L \tan \emptyset - C).$$

The primary present challenge to utilization of solar energy is the cost: the return on investment. Clearly the effort of switching from conventional power sources to solar power harvesting is unwarranted in a purely economic sense, if the pay-back time is greater than the expected life of the apparatus: i.e., if the return on investment is negative. Even if the return on investment is positive but less than that available by other investments (such as 6%-8%) then any incentive to purchase a solar harvester is on a non-economic basis. For a final comparison: if the actual payback time on such an investment including all costs is greater than 12 years, then it is unwise for one to invest capital here rather than in other higher-yielding (>6%) opportunities.

By virtue of its simplified construction, low cost materials, resistance to aging or wear or weather, simplicity and speed of installation, and use of 200% of the available sunlight to replace existing energy sources, the expected payback time for the present invention is projected to be between 3 and 5 years: an economically compelling return on investment of between and 16% and 27% annually.

The present invention, in summary, provides a system wherein planar solar reflectors are mounted for simultaneous east-west rotation about parallel axes so that each can track the sun in its movement while reflecting sunlight onto a common solar energy converter. This maximizes the conversion value of a given amount of roof area in harvesting substantially all the available solar energy falling on that area. The solar power is concentrated on the solar power converter by a ratio of approximately the total number of reflective less one for shadowing. For a relatively long reflector or series of axially contiguous reflectors, concentration can be very nearly doubled by addition of a reflective north wall to create a second, virtual sun to illuminate the converter.

Aside from possible providing energy where none is otherwise available, the economic value of a solar power harvester lies in the market value of the oil, natural gas or coal which its use will displace. The solar power harvester of the present teaching may harvest useful heat by conduction of a heat absorbing fluid through the converter tube; or electrical energy by suspension of an array of photovoltaic cells at the focal line of the concentrator; or preferably may harvest both forms of energy simultaneously by suspending photovoltaic cells on a coolant pipe at the focus of the collector to harvest 22%-40% of the incident solar power as electricity, and the remainder as useful thermal energy. Thus substantially all the solar irradiance can be converted to valuable energy.

Further, in the preferred embodiment, by enclosing the solar cells and their support frame, together with the driving mechanism within an enclosure, failures and deterioration associated with a corrosive environment and weather are reduced to substantially increase the useful life of the system and enhance its reliability. Such enclosure is accomplished at a reasonable cost to enhance the performance of the system by minimizing heat losses to the environment.

By use of wires as both pivoting supports and spring members, mechanical hysteresis, wear, and temperature effects are minimized: allowing a virtually unlimited operating lifetime. By this method also, considerable cost savings in fabrication and installation may be enjoyed.

In that installation costs are typically the largest single element of acquisition costs, the use of a horizontal structure without large, elevated tracking systems permits simple and low cost installation, with ready access for maintenance if ever needed.

The addition of a simple reflective north wall of the present teaching effectively doubles the power which may be harvested from a given collector footprint by a horizontal planar collector, and provides significantly more useful power than from any complex structure tracking the sun in a two-axis movement.

All of these advantages reduce the cost of all system components and installation, maximize the solar power harvest for a given available land or roof area, and increase system life and reliability.

Having thus described in detail a preferred embodiment of the invention, persons skilled in the art will be able to modify certain portions of the structure which has been illustrated and to substitute equivalent elements for those disclosed while continuing to practice the principle of the invention, and it is, therefore, intended that all such modifications and substitutions be covered as they are embraced within the spirit and scope of the appended claims.

What is claimed is:

1. A heliostat comprising
a plurality of elongate reflective slats, the slats tensioned along the elongated direction and arranged to be able to rotate without mutually interfering;
a plurality of tensioned wires coupled to the plurality of slats in the elongated direction, the tensioned wires providing longitudinal support by tensioning the slats, and the tensioned wires further providing rotary axes to the slats at the center of rotation of the slats; and
a rotation mechanism for co-rotating the slats, in tracking the movement of the sun, wherein the rotation mechanism comprises
a plurality of following pins, wherein each following pin is affixed to one of the plurality of tensioned wires,
a comb having a plurality of teeth, wherein the one of the plurality of tensioned wires is twisted to provide a torque to the each following pin so that the each following pin is rested against a tooth of the plurality of teeth.

2. A heliostat as in claim 1 wherein each tensioned wire acts as a frictionless and wear-free bearing and pivot for the slat.

3. A heliostat as in claim 1 wherein the tensioned wires further provide rotary spring capability to bias slat rotation in a common direction.

4. A heliostat as in claim 1 wherein the plurality of slats are each angularly disposed to reflect solar irradiance toward a common focal line.

5. A heliostat as in claim 4 further comprising an energy converter co-located with the focal line.

6. A heliostat as in claim 1 wherein a tensioned wire of the plurality of tensioned wires is coupled to an end of a slat of the plurality of slats.

7. A heliostat as in claim 1 further comprising a frame supporting the plurality of elongate flat reflective slats and a stabilizer rod anchored to the frame at one end and serving at its cantilevered end to the prevent lateral shift of the axis of an index tensioned wire.

8. A heliostat as in claim 1 wherein each slat is tilted in relation to its distance from a central slat.

9. A heliostat as in claim 1 further comprising a power converter and a sun sensor which measures a position of a centroid of reflected sunlight rays relative to the position of the power converter.

10. A heliostat as in claim 9 wherein the sun sensor comprises a photovoltaic (PV) bi-cell, the PV bi-cell comprising a PV cell A and a contiguous PV cell B, each of lateral extent equal to one-half of the PV cell array width and disposed symmetrically to each side of a focal axis; and wherein the sun sensor provides a differential signal of the form (A−B) divided by (A+B).

11. A heliostat as in claim 10 further comprising a threshold circuit responsive to the sum (A+B), wherein a motor drive is actuated to return a direction of the line of sight to a pre-selected eastward direction when the sum is less than a pre-selected threshold.

12. A heliostat as in claim 10 further comprising a temperature sensor on the power converter serving to generate a signal C proportional to the amount by which the temperature exceeds a pre-selected safe temperature; and wherein the rotation mechanism is driven to minimize the normalized error signal (A−B+C) divided by (A+B).

13. A heliostat as in claim 1 further comprising a housing enclosing the heliostat, wherein the housing comprises transparent plates oriented toward east, west and south.

14. A heliostat as in claim 13 further comprising a north-oriented plate which is reflective on its south side.

15. A solar harvester comprising
a plurality of elongate reflective slats, the slats being angularly disposed to reflect solar irradiance toward a common focal line and tensioned along the elongated direction, the slats arranged to be able to rotate without mutually interfering;
a plurality of index tensioned wires, each index tensioned wire coupled to one end of each slat, the index tensioned wire acting as a rotary axis positioned so that the slats are balanced about the center of rotation;
a plurality of pivot tensioned wires, each pivot tensioned wire coupled to one other end of each slat, the pivot tensioned wire acts as a bearing and pivot for the slat, and positioned so that the slats are balanced about the center of rotation;
wherein each of the slats is longitudinally tensioned by the tensioned wires;
a rotation mechanism coupled to the index tensioned wires for co-rotating the slats, the rotation mechanism comprising
a plurality of following pins, wherein each following pin is affixed to a tensioned wire;
a linear array positioner serving to mechanically actuate rotation of the slats by moving the following pins, wherein the one of the plurality of tensioned wires is twisted to provide a torque to the each following pin so that the each following pin is rested against the linear array positioner;

an energy converter served to absorb sunlight reflected from the plurality of slats, the energy converter co-located with the focal line; and a sun sensor whose output signal is indicative of the location of the sun relative to the energy converter for optimizing a reflective irradiance by rotating the slats by actuating the linear array positioner.

16. A solar harvester as in claim 15 wherein each slat is additionally tilted in relation to its distance from a central slat.

17. A solar harvester as in claim 15 wherein the sun sensor measures a position of a centroid of reflected sunlight rays relative to the position of the energy converter.

18. A solar harvester as in claim 15 wherein the sun sensor comprises a photovoltaic (PV) bi-cell, the PV bi-cell comprising a PV cell A and a contiguous PV cell B, each of lateral extent equal to one-half of the PV cell array width and disposed symmetrically to each side of a focal axis; and wherein the sun sensor provides a differential signal of the form (A−B) divided by (A+B).

19. A solar harvester as in claim 18 further comprising a threshold circuit responsive to the sum (A+B), wherein a motor drive is actuated to return a direction of the line of sight to a pre-selected eastward direction when the sum is less than a pre-selected threshold.

20. A solar harvester as in claim 15 further comprising a housing, wherein the housing comprises transparent plates oriented toward east, west and south.

21. A solar harvester as in claim 20 further comprising a north-oriented plate which is reflective on its south side.

22. A solar harvester as in claim 15 wherein the energy converter comprises circulating fluid to extract thermal energy.

23. A solar harvester as in claim 22 wherein the circulating fluid is pressurized up to 40 psig.

24. A solar harvester as in claim 15 wherein the energy converter comprises photovoltaic cells.

25. A solar harvester as in claim 24 further comprising a circulating fluid to cool the energy converter.

26. A solar harvester as in claim 25 wherein the circulating fluid limits the temperature of the energy converter to less than 50° C.

27. A heliostat comprising a plurality of elongate reflective slats, the slats tensioned along the elongated direction and arranged to be able to rotate without mutually interfering;

a plurality of tensioned wires each affixed to a slat of the plurality of slats at a location adjacent to an end of the slat such that the slat is balanced about its center of rotation, the tensioned wires providing longitudinal support by tensioning the slats in the elongated direction, and the tensioned wires further providing rotary axes to the slats;

a rotation mechanism coupled to the plurality of slats for co-rotating the slats in tracking the movement of the sun, wherein the rotation mechanism comprises a plurality of following pins, wherein each following pin is affixed to one of the plurality of tensioned wires, a comb having a plurality of teeth, wherein the one of the plurality of tensioned wires is twisted to provide a torque to the each following pin so that the each following pin is rested against a tooth of the plurality of teeth; and an enclosure for housing the plurality of slats, wherein the enclosure comprises at least two transparent surfaces on an upper side, wherein the transparent surfaces are disposed at an angle with respect to each other to form a sloped roof.

\* \* \* \* \*